(12) United States Patent
Lee

(10) Patent No.: US 9,184,060 B1
(45) Date of Patent: Nov. 10, 2015

(54) PLATED METAL HARD MASK FOR VERTICAL NAND HOLE ETCH

(71) Applicant: Lam Research Corporation, Fremont, CA (US)

(72) Inventor: William T. Lee, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 14/541,542

(22) Filed: Nov. 14, 2014

(51) Int. Cl.
*H01L 21/32* (2006.01)
*H01L 21/266* (2006.01)
*H01L 21/308* (2006.01)
*H01L 21/311* (2006.01)
*H01L 21/02* (2006.01)
*H01L 21/033* (2006.01)

(52) U.S. Cl.
CPC .... *H01L 21/31144* (2013.01); *H01L 21/02282* (2013.01); *H01L 21/0337* (2013.01)

(58) Field of Classification Search
CPC ............... H01L 21/31144; H01L 21/02282; H01L 21/0337; H01L 21/02642; H01L 21/02645; H01L 21/0268; H01L 21/027; H01L 21/266; H01L 21/28238; H01L 21/308; H01L 21/311; H01L 21/32; H01L 21/32051
USPC ......... 438/637, 201, 199, 203, 210, 257, 644, 438/680, 674
See application file for complete search history.

(56) References Cited

U.S. PATENT DOCUMENTS

| | | |
|---|---|---|
| 3,798,056 A | 3/1974 | Okinaka et al. |
| 5,028,585 A | 7/1991 | Spencer |
| 5,795,824 A | 8/1998 | Hancock |
| 6,066,366 A | 5/2000 | Berenbaum et al. |
| 6,074,544 A | 6/2000 | Reid et al. |
| 6,235,163 B1 | 5/2001 | Angelo et al. |
| 6,559,052 B2 | 5/2003 | Li et al. |
| 6,713,122 B1 | 3/2004 | Mayer et al. |
| 7,192,891 B2 | 3/2007 | Goo et al. |
| 7,220,451 B2 | 5/2007 | Aaltonen et al. |
| 7,449,098 B1 | 11/2008 | Mayer et al. |
| 7,517,817 B2 | 4/2009 | Goo et al. |
| 7,569,500 B2 | 8/2009 | Metzner et al. |
| 7,615,449 B2 * | 11/2009 | Chung et al. ................... 438/259 |
| 7,622,383 B2 * | 11/2009 | Kim et al. ....................... 438/657 |
| 7,645,696 B1 | 1/2010 | Dulkin et al. |
| 7,682,966 B1 | 3/2010 | Rozbicki et al. |
| 7,690,324 B1 | 4/2010 | Feng et al. |
| 7,884,018 B2 | 2/2011 | McFeely et al. |
| 8,168,540 B1 | 5/2012 | Reid et al. |
| 8,278,216 B1 | 10/2012 | Alers et al. |
| 8,622,020 B2 | 1/2014 | Thie et al. |
| 8,728,956 B2 | 5/2014 | LaVoie et al. |
| 8,748,249 B2 | 6/2014 | Yang et al. |
| 2005/0001325 A1 * | 1/2005 | Andricacos et al. .......... 257/762 |

(Continued)

*Primary Examiner* — Chuong A Luu
(74) *Attorney, Agent, or Firm* — Weaver Austin Villeneuve & Sampson LLP

(57) ABSTRACT

The embodiments herein relate to methods, apparatus, and systems for forming recessed features at high aspect ratios. Often, such features are formed in the context of fabricating a vertical NAND (VNAND) memory device. Various disclosed embodiments relate to process flows that involve depositing and shaping sacrificial posts on a metal seed layer that covers an underlying stack of materials, electroplating or electroless plating metal hard mask material around the sacrificial posts, removing the sacrificial posts, and etching the underlying stack of materials to form a high aspect ratio recessed feature.

21 Claims, 9 Drawing Sheets

(56) References Cited

U.S. PATENT DOCUMENTS

| | | |
|---|---|---|
| 2005/0266682 A1* | 12/2005 | Chen et al. .................... 438/637 |
| 2006/0024953 A1* | 2/2006 | Papa Rao et al. ............. 438/629 |
| 2007/0178682 A1* | 8/2007 | Chiang et al. ................. 438/584 |
| 2009/0208880 A1* | 8/2009 | Nemani et al. ................ 430/323 |
| 2009/0269507 A1 | 10/2009 | Yu et al. |
| 2011/0256726 A1 | 10/2011 | LaVoie et al. |
| 2014/0030444 A1 | 1/2014 | Swaminathan et al. |
| 2014/0209562 A1 | 7/2014 | LaVoie et al. |

\* cited by examiner

PLATED METAL HARD MASK FOR VERTICAL NAND HOLE ETCH

BACKGROUND

With continued pressure to make increasingly dense devices, the semiconductor device industry is switching to the use of 3D memory structures. For instance, NAND flash memory has moved from a planar configuration to a vertical configuration (VNAND). This vertical configuration permits the memory devices to be formed at significantly greater bit density. One operation involved in formation of VNAND devices involves etching holes into a stack of alternating layers of materials. As the stacks of alternating layers of materials grow to include larger numbers of layers, this etching operation becomes increasingly difficult.

SUMMARY

Certain embodiments herein relate to methods for forming a recessed feature on a substrate. Often the substrate includes a stack of alternating materials, and the feature etched has a relatively high aspect ratio. Various embodiments utilize a metal mask material to protect the stack during etching. This metal mask material may be formed around sacrificial posts that are removed after formation of the metal mask.

In one aspect of the embodiments herein, a method is provided for forming recessed features on a substrate, the method including: (a) forming sacrificial posts on the substrate, said substrate including a conductive seed layer over an underlying material, where the sacrificial posts are formed directly above regions where the recessed features are to be formed in the underlying material; (b) depositing a metal hard mask material on the conductive seed layer around the sacrificial posts to form a metal hard mask layer through electroplating, electroless plating, or chemical vapor deposition; (c) removing the sacrificial posts to form openings in the metal hard mask layer; and (d) etching the underlying material to thereby form the recessed features directly under the openings in the metal hard mask layer.

In certain embodiments, the underlying material includes alternating layers of silicon oxide and silicon nitride. In other embodiments, the underlying material includes alternating layers of silicon oxide and polysilicon.

The method may further include after (c) and before (d), depositing additional metal mask material on the metal hard mask layer through electroless plating or chemical vapor deposition to thereby narrow the openings in the metal hard mask layer. This additional metal mask material may include a material selected from the group consisting of: Co, Ni, Ru, Sn, In, Pd, Ge, and combinations thereof.

As noted, the recessed features may have a relatively high aspect ratio. In some embodiments, the recessed features have an aspect ratio of at least about 40. In certain cases, the recessed features have an aspect ratio of at least about 60. The depth of the features may be at least about 2.5 µm in some cases.

Various materials can be used for the metal hard mask material. For instance, the metal hard mask material may include a material selected from the group consisting of Co, Ni, Ru, Sn, In, Pd, Ge, and combinations thereof. Similarly, the conductive seed layer may include a material selected from the group consisting of Co, Ru, Ti, Cr, Cu, and combinations thereof.

The sacrificial posts may also be any of several different materials. For example, in some cases the sacrificial posts include a material selected from the group consisting of carbon, silicon, silicon oxide, silicon nitride, silicon carbide, and combinations thereof. The material of the sacrificial posts may be amorphous in various embodiments. The sacrificial posts may have a width between about 5-200 nm. The aspect ratio of the sacrificial posts may be at least about 2:1. In certain embodiments, forming the sacrificial posts includes depositing sacrificial post material, depositing one or more intermediate layers, depositing a layer of photoresist, patterning the photoresist, etching the one or more intermediate layers, and etching the sacrificial post material to form the sacrificial posts. The sacrificial posts may be deposited through a variety of techniques, including for example CVD processes, PVD processes, ALD processes, or spin-on processes.

As mentioned, the metal hard mask layer may be deposited through various techniques. In some embodiments the metal hard mask layer is deposited through electroplating. In other embodiments the metal hard mask layer is deposited through electroless plating. In still other embodiments, the metal hard mask layer is deposited through CVD techniques. The metal hard mask layer may have a thickness between about 25 nm and about 2.5 µm. In various embodiments, the method may further include after (c) and before (d), removing the conductive seed layer in the openings of the metal hard mask layer. These and other features will be described below with reference to the associated drawings.

DETAILED DESCRIPTION

Figure 1A:
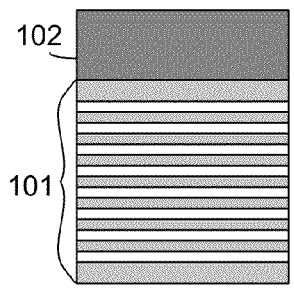
FIGS. 1A-1F depict a partially fabricated semiconductor device as it undergoes processing to form an etched recess using a conventional hard mask (e.g., a mask comprising amorphous carbon).

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. The following detailed description assumes the invention is implemented on a wafer. However, the invention is not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

I. Context and Process Flows

One operation involved in fabrication of VNAND devices involves etching recessed features into alternating layers of materials. Current products include memory devices incorporating 32 individual devices arranged in a single vertical column, each storing one or more bits. These devices are fabricated using a process that etches through 32 pairs of silicon oxide/silicon nitride or silicon oxide/polysilicon layers that are arranged in a stack. In some cases, the stack may contain certain additional layers provided for various functions/purposes. In a typical case, a stack of 32 pairs of these layers is about 2 μm thick, which means that the etch process must etch a feature that is about 2 μm deep. An example of a typical critical diameter (width) of such a feature is about 50 nm, resulting in an aspect ratio of about 40:1 (more simply stated as 40).

By increasing the number of pairs of alternating layers in a stack, devices having even greater bit density can be fabricated. For instance, it is expected that certain memory devices may be fabricated with between about 46-64 layer pairs, or even between about 72-92 layer pairs in various embodiments. In these future devices, it is anticipated that the critical dimension will likely remain about the same or become smaller, involving features having an aspect ratio that may be at least about 80, or at least about 100. However, conventional etching processes and hard mask materials are not capable of forming features at such high aspect ratios, as discussed further herein. While many of the disclosed embodiments pertain to VNAND memory devices, the disclosed etching and deposition processes may be applied in other applications such as logic devices.

Figure 7:
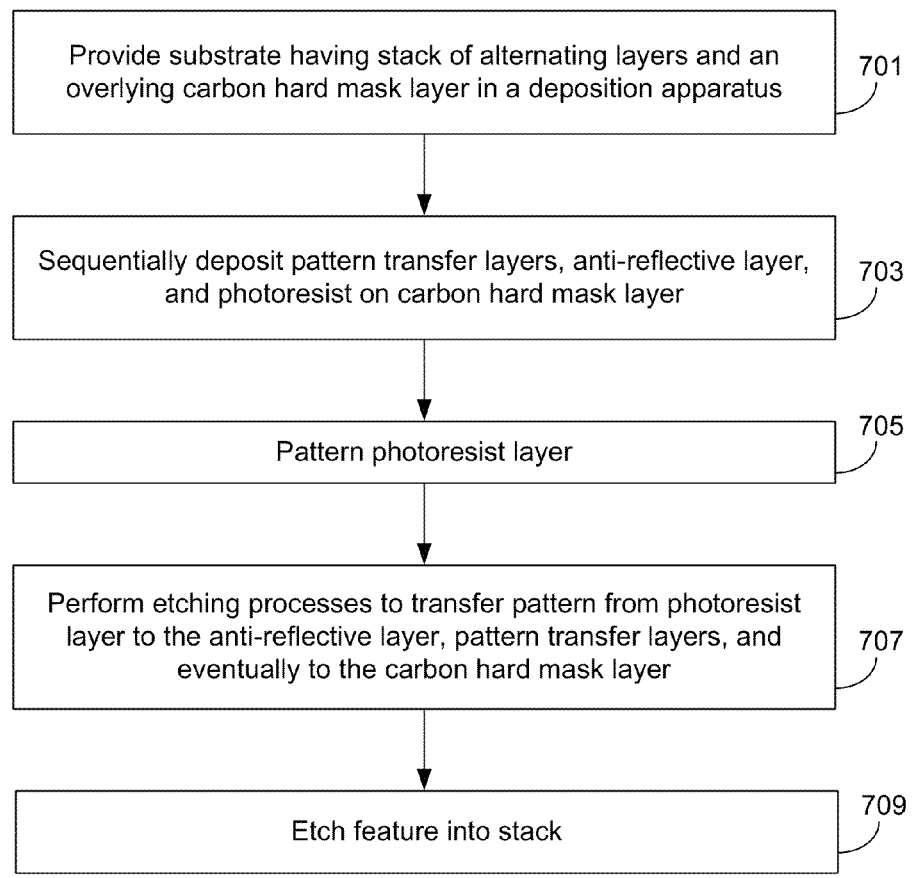
FIG. 7 is a flow chart depicting the process described in relation to FIGS. 1A-1F.
Figure 8:
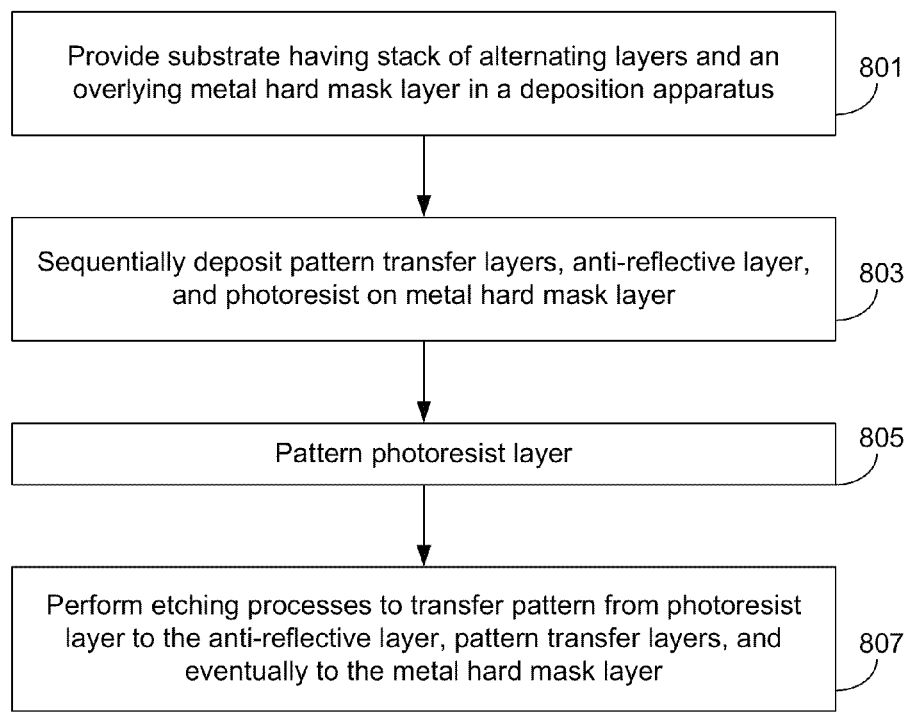
FIG. 8 is a flow chart depicting the process described in relation to FIGS. 2A-2E.
Figure 9:
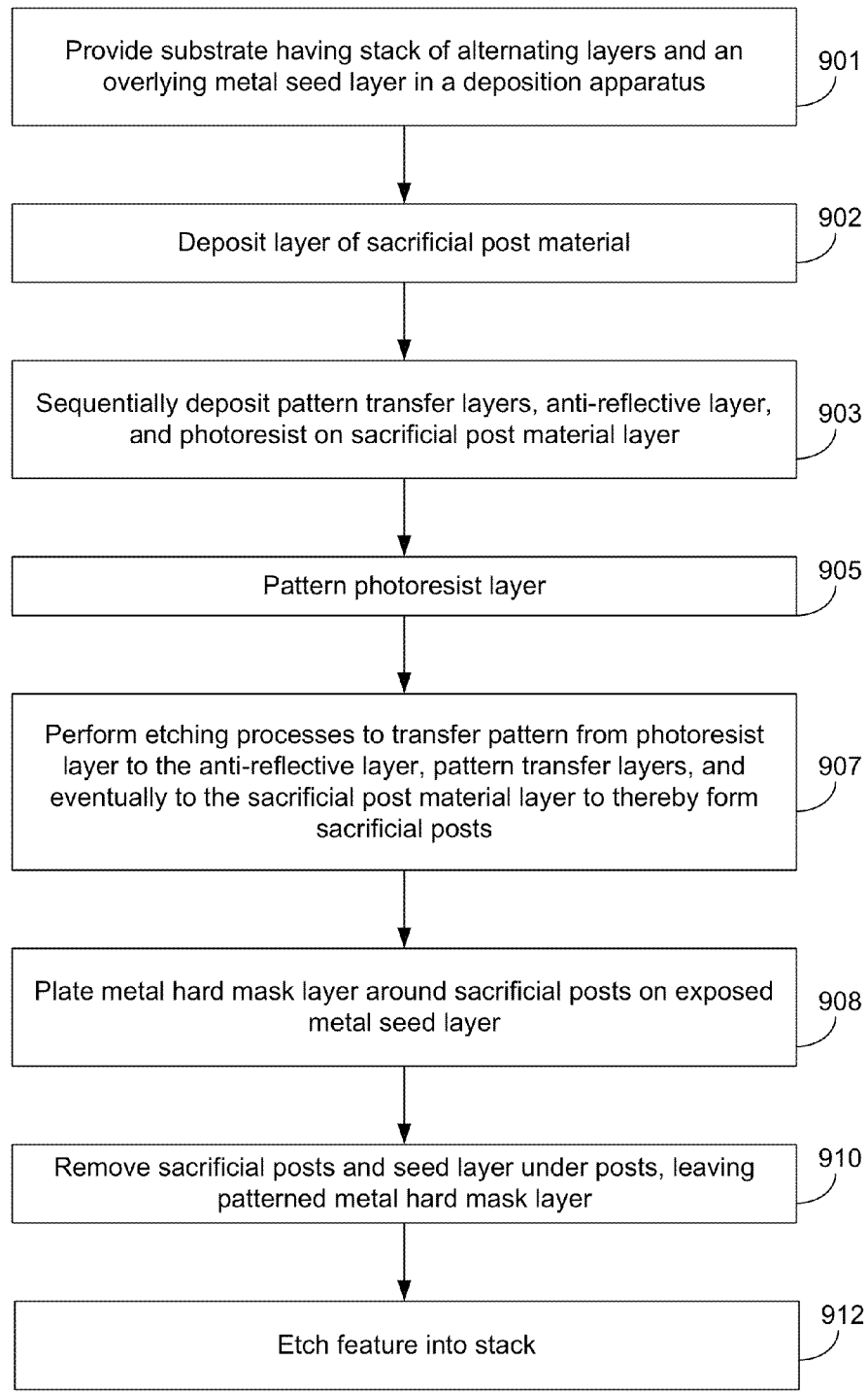
FIG. 9 is a flow chart depicting the process described in relation to FIGS. 3A-3F.

FIGS. 1A-1F illustrate a partially fabricated semiconductor device as it undergoes various processing operations for forming such features. FIG. 7 shows a flowchart describing the various process operations in FIGS. 1A-1F. FIGS. 2A-2E illustrate a partially fabricated semiconductor device as it undergoes various processing operations for forming such features according to an alternative method. FIG. 8 shows a flowchart describing the various processing operations in FIGS. 2A-2E. The process flows shown in FIGS. 1A-1F (and related FIG. 7) and FIGS. 2A-E (and related FIG. 8) each present certain difficulties that are overcome by the methods shown in FIGS. 3A-3F (and related FIG. 9) and 4A-4F (and related FIG. 10).

Figure 1B:
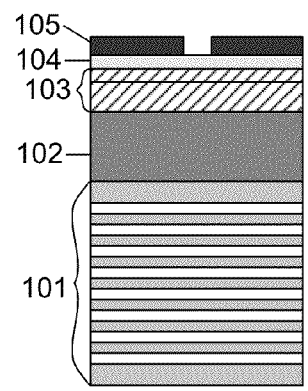
Figure 1C:
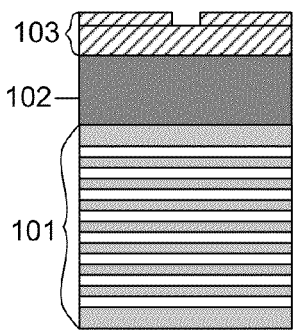
Figure 1D:
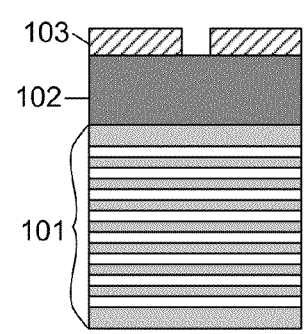
Figure 1E:
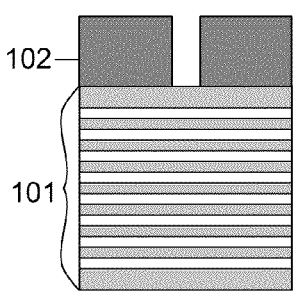
Figure 1F:
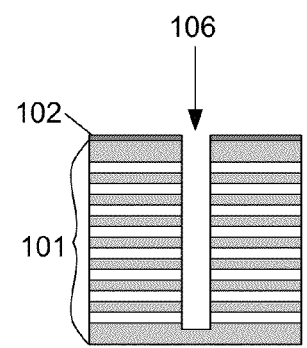

Beginning with FIG. 1A and operation 701 of FIG. 7, a substrate is provided in a deposition apparatus. The substrate includes a stack 101 of alternating layers of material. In certain cases, the layers alternate between an oxide material (e.g., silicon oxide) and a nitride material (e.g., silicon nitride). In other cases, the layers alternate between an oxide material (e.g., silicon oxide) and polycrystalline silicon (i.e., polysilicon). The topmost layer of the stack 101 may be a silicon nitride layer in some cases. Overlying the stack 101 in this example is an amorphous carbon hard mask 102. Next, at operation 703, a series of pattern transfer layers 103, an anti-reflective layer 104, and a layer of photoresist 105 are sequentially deposited on the amorphous carbon hard mask 102. At operation 705, the photoresist layer 105 is patterned to define where the features 106 are to be etched into the stack 101, as shown in FIG. 1B. The pattern transfer layers 103 are provided to help transfer the pattern from the photoresist layer 105 to amorphous carbon hard mask 102 and then to the stack 101. A series of etching operations takes place at operation 707 to transfer the pattern vertically downward through the layers. The photoresist layer 105, anti-reflective layer 104, and pattern transfer layers 103 may be removed during these etching operations, as shown in FIGS. 1C and 1D. Eventually, the pattern is transferred to the amorphous hard mask 102, as shown in FIG. 1E. From here, an additional etching operation 709 takes place to etch the pattern into the stack 101, as shown in FIG. 1F. Oftentimes, the feature 106 is a hole/cylinder.

While the process flow shown in FIGS. 1A-1F may be adequate for forming features at limited depths, significant difficulty is reached when forming features at greater depths. For example, while this process flow may be adequate for forming 1.5-2 μm deep holes typically used in stacks having 24 or 36 pairs of layers in certain cases, this process flow is much less promising for forming 3-4 μm deep holes useful in stacks having greater numbers of pairs of layers, such as those that will be used in state of the art VNAND devices. Such devices may have greater number of layer pairs, for example at least about 40 pairs, at least about 50 pairs, at least about 60 pairs, at least about 70 pairs, at least about 90 pairs, etc. The aspect ratios of the features in such devices may be at least about 40, at least about 50, at least about 60, at least about 80, or at least about 100. The aspect ratio of a feature is a comparison of the depth of a feature to the critical dimension of the feature (often the diameter or width of a feature). For example, a hole having a depth of 2 μm and a width of about 50 nm has an aspect ratio of about 40:1, stated more simply as 40.

One reason that the process flow in FIGS. 1A-1F is limited to forming relatively shallow features is that the amorphous carbon hard mask 102 is not sufficiently etch resistant to withstand the amount of processing required to form the features 106 at greater depths. In other words, the selectivity between the amorphous hard mask 102 and the underlying stack 101 to be etched is too low, and the amorphous carbon hard mask 102 may be etched away before the feature 106 is etched to its final depth. Example etch rate selectivity between underlying stack materials and a PECVD-deposited amorphous hard mask in VNAND applications may fall between about 2:1-3:1 (etch rate of stack:etch rate of hard mask). A related problem in some cases is that the amorphous carbon hard mask 102 may become faceted (i.e., over etched near the top corners of the pattern) such that the pattern transfer into the stack is imprecise. Under current processing conditions, a 36 pair stack being etched to about 2 μm deep requires an amorphous carbon hard mask that is about 1-1.5 μm thick.

In order to etch deeper holes (e.g., where the stack includes additional pairs of layers) using the current materials, the thickness of the carbon hard mask 102 would need to be increased. However, the amount by which the thickness of the carbon hard mask 102 would need to be increased in order to form features at 3-4 µm deep is not feasible. The relationship between the etch depth and the minimum thickness of amorphous carbon hard mask needed to achieve that etch depth is not linear. Because of the directional nature of ion etching and the geometry of the features being etched, the stack materials are etched relatively quickly at shallow depths (where a greater proportion of ions are able to impinge upon the substrate at the bottom of the feature), and relatively slowly at deeper depths (where a lower proportion of ions are able to impinge upon the substrate at the bottom of the feature, since a greater proportion of the ions instead impact a sidewall of the feature). Because the amorphous carbon hard mask 102 is etched at a relatively constant rate, one result of the decreasing etch rate in a feature is that per distance etched in the feature, the amount of carbon hard mask etched away increases with increasing etch depth. In other words, significantly more carbon hard mask is etched away when the feature is being etched from 3 µm to 4 µm compared to when the feature is being etched from 1 µm to 2 µm. This non-linear relationship means that a very thick amorphous carbon hard mask would be needed to adequately protect the substrate and maintain the desired pattern during etching.

In many cases this thick carbon hard mask is infeasible. One reason the thick carbon hard mask is not desirable is that the processing sequence required to pattern the current 1-1.5 µm thick amorphous carbon hard mask layer is already quite complicated and expensive. A single layer of photoresist is insufficient to protect the stack while deep features are being etched because the photoresist would erode long before the feature is etched to its full depth. To address this issue, modern fabrication techniques provide multiple stages of pattern transfer between photolithography and pattern definition in the hard mask. Extending the amorphous carbon hard mask to greater thicknesses would further complicate this process, requiring extra materials and thicker pattern transfer layers that take longer to deposit and etch. Further, many hard mask films are deposited through CVD or PVD processes, and have an inherent stress that can cause the substrate to bow/warp. The bowing may result in the substrate becoming dome-shaped or dish-shaped, depending on whether the stress is compressive or tensile. This substrate bowing issue is more problematic for thicker mask layers, and may prevent the substrate from registering properly on a substrate support in future processing steps. Substrate bowing is particularly problematic in the context of photolithography operations, which often involve very precise optics that must be applied to very flat substrates. As such, there is a need for a method of forming deeply recessed features using hard mask materials that can withstand the processing conditions necessary to form such features.

One approach to address these problems is to replace conventional hard mask materials such as amorphous carbon with a higher selectivity hard mask material such as metal. An example process flow using a metal hard mask is shown in FIGS. 2A-2E, and is further described with respect to the flowchart in FIG. 8. In this implementation, a metal hard mask 202 is used instead of the amorphous carbon hard mask 102 used in FIGS. 1A-1F. Metal hard masks exhibit greater selectivity during etching with relevant etch chemistry, making them a possible alternative to amorphous carbon or other hard masks. When effectively patterned, metal hard masks can withstand the processing conditions used to etch the deep (i.e., high aspect ratio) features. The process steps shown in FIGS. 2A-2D are otherwise identical to those shown in FIGS. 1A-1D (further, the process steps 801-807 of FIG. 8 are otherwise identical to operations 701-707 of FIG. 7), and for the sake of brevity the description will not be repeated.

Figure 2A:
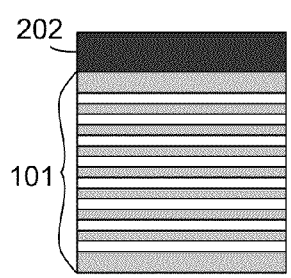
FIGS. 2A-2E depict a partially fabricated semiconductor device as it undergoes processing in an attempt to form an etched recess using a metal hard mask.
Figure 2B:
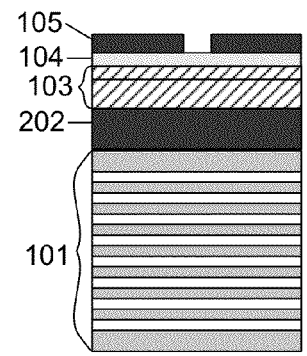
Figure 2C:
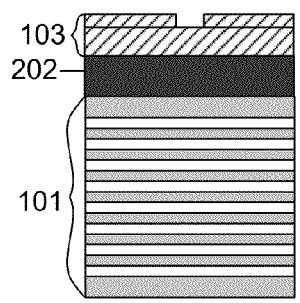
Figure 2D:
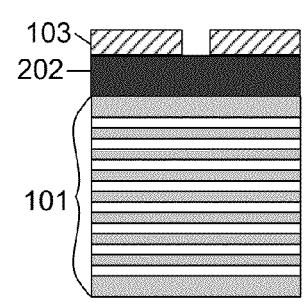
Figure 2E:
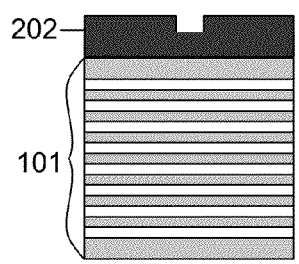

When the metal hard mask 202 is etched in FIG. 2E and operation 807, however, certain differences arise. In particular, it may be difficult to etch through the metal hard mask 202, and this etching is needed to impart the desired pattern onto the underlying stack 101. One reason that this etching operation is difficult is that many of the metals used for the hard mask 202 do not have volatile byproducts when etched using conventional halide-based etch chemistry. As such, the byproducts can become stuck in the etched features, for example along the feature sidewalls, and can cause the etch process to effectively shut down before the pattern is adequately transferred to the metal hard mask layer 202. Certain metals may be more problematic than others. For instance, when tungsten is etched, the tungsten metal may react with certain etch chemistry/byproducts to form a non-volatile material (e.g., including a combination or sub-combination of Si, O, N, F, and W) that can coat the interior of the feature at the etch front and cause the etching process to slow or stop.

One possible approach to addressing the etching challenges would be to develop a new etching process. However, this approach would involve reengineering the current long-standing etch process and would be expensive and difficult. It would be preferable to develop a process that utilizes current etch chemistries/processes (e.g., fluorocarbon-based processes).

PVD-deposited metal hard masks have been used in certain applications. One limitation of these PVD deposition methods is that certain metals are not easy to sputter. For instance, some metals may not have suitable sputtering targets, making PVD deposition difficult or impossible. Another problem with PVD-deposited metal hard masks is that PVD-deposited films often have an inherent internal stress, and can therefore cause the substrate bowing problems mentioned above. Further, PVD-deposited metal hard masks may be deposited with relatively large metal crystal grains. The boundaries of such grains can cause a feature etched in the metal to have undesirably jagged edges rather than a desired smooth pattern.

Returning to the embodiment of FIGS. 2A-2E and FIG. 8, because the metal hard mask 202 is not successfully etched in operation 807, the underlying stack 101 is not etched, and the process fails. Therefore, while metal hard masks are promising in terms of protecting a stack during etching of deep features (e.g., 3-4 µm deep, with aspect ratios of at least about 40 in some embodiments), a different/improved process flow is needed. The improved process flow should avoid the need to etch a pattern into the metal hard mask layer.

FIGS. 3A-3F present an alternative and improved process flow for forming a recessed feature in a semiconductor substrate using a metal hard mask that is plated around a sacrificial pre-formed post (e.g., using electroplating and/or electroless plating). The process flow is further described in relation to the flow chart shown in FIG. 9. The sacrificial pre-formed post is positioned directly above where the recessed feature is to be formed, such that when the metal hard mask is formed, it has a desired shape and no difficult ion etching step is required to pattern the metal hard mask. The process begins at operation 901 and FIG. 3A where a stack 301 of alternating layers of materials is provided, with a metal seed layer 310 above the stack 301. The stack 301 may include alternating layers of oxide and nitride or alternating layers of oxide and polysilicon, as discussed above. The metal seed layer 310 may be deposited on the stack 301 through any available means. In certain embodiments, the metal seed layer 310 is deposited through physical vapor deposition (PVD), chemical vapor deposition (CVD) or atomic layer deposition (ALD). PVD and CVD may be particularly useful compared to ALD due to the quicker processing times involved, though ALD processes may also be used in some embodiments. The seed layer should be made of a material that is easily removable, as this layer is later removed in areas where the recessed feature 306 is to be formed.

Next, at operation 902, a layer of sacrificial post material 302 is deposited, followed by deposition of one or more pattern transfer layers 303, an anti-reflective layer 304, and a photoresist layer 305 in operation 903. The photoresist layer is patterned in operation 905, as shown in FIG. 3B. Notably, the photoresist pattern is the inverse of that used in FIGS. 1B and 2B. The photoresist is patterned such that remaining photoresist is positioned above where a feature is to be etched. The photoresist is removed in areas where no feature is to be etched. The sacrificial post material 302 may be an amorphous material. Amorphous materials can be etched/patterned with better smoothness compared to crystalline materials, thereby resulting in more precise pattern transfer and smoother edges on an etched feature. In certain cases the sacrificial post material 302 is amorphous silicon or amorphous carbon. The sacrificial post material 302 is horizontally positioned where a later deposited metal hard mask layer will be. The sacrificial post material 302 should be deposited at a thickness that is slightly or moderately greater than a thickness of the later deposited metal mask.

Figure 3A:
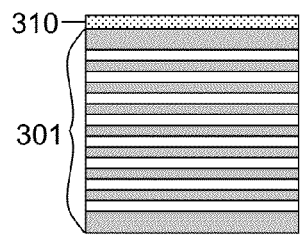
FIGS. 3A-3F depict a partially fabricated semiconductor device as it undergoes processing to form an etched recess using a metal hard mask that is plated around a patterned sacrificial post.
Figure 3B:
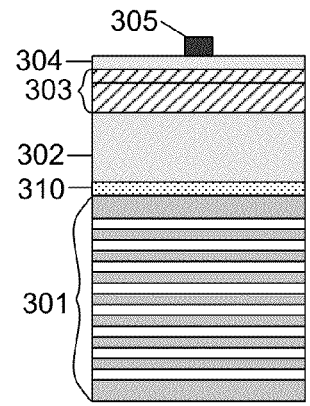
Figure 3C:
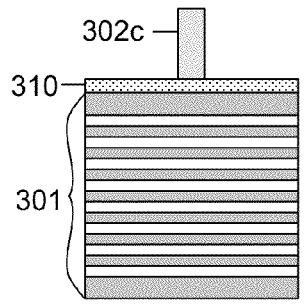

After the photoresist is patterned, a series of etching processes may take place in operation 907 to transfer the pattern from the photoresist layer 305 to the layer of sacrificial post material 302, thereby forming the sacrificial post 302c shown in FIG. 3C. The width of the sacrificial post in various embodiments may be between about 20-100 nm, for example between about 30-60 nm, or between about 40-50 nm, and the height of the sacrificial post may be between about 200-1000 nm, for example between about 300-500 nm. In these or other embodiments, the sacrificial post 302c may have an aspect ratio between about 2:1-50:1, for example between about 10:1-20:1. The optimal aspect ratio will depend upon the materials being etched, the material of the metal hard mask, and the depth of the feature being etched. When viewed from above, the sacrificial posts 302c may be circular, square, rectangular, etc.

For many applications, a series of sacrificial posts are formed. The sacrificial posts may be laid out in a square pattern, a triangular pattern, a hexagonal pattern, etc. as required for the application. For some applications, the center-to-center separation distance between adjacent posts is between about 50-200 nm. In certain cases, the center-to-center separation distance of the sacrificial posts may be between about 80-120 nm.

Figure 3D:
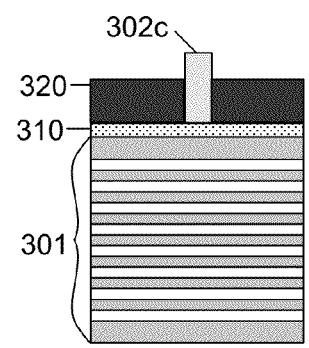
Figure 3E:
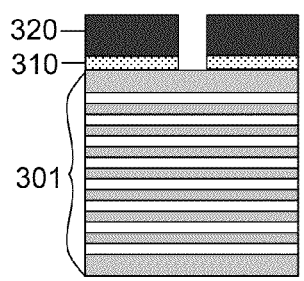

One result of this etching operation 907 is to expose the seed layer 310 positioned under the layer of sacrificial post material 302. Next, at operation 908, a metal hard mask layer 320 is deposited, for example using electroplating or electroless plating, as shown in FIG. 3D. Alternatively, the metal hard mask layer may be deposited through selective CVD metal processes. One example material for use as a selective CVD-deposited metal is cobalt, though other metals may also be used. The metal hard mask layer 320 is deposited around the sacrificial post 302c. The sacrificial post 302c should extend above the uppermost height of the metal hard mask layer 320 such that the sacrificial post 302c can be easily removed. Next, at operation 910 the sacrificial post 302c is removed and the metal hard mask layer 320 remains, as shown in FIG. 3E. The sacrificial post 302c is removed using a process that has high selectivity between the sacrificial post material 302 and the material of the metal hard mask layer 320. The seed layer 310 positioned under the sacrificial post 302c is similarly removed.

Figure 3F:
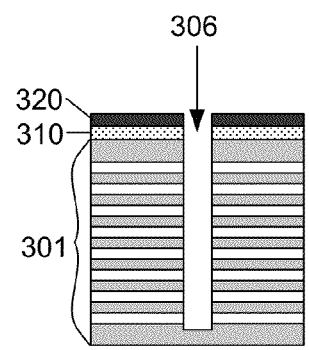

At this point the metal hard mask layer 320 is patterned and can be effectively used as a hard mask while the stack 101 is etched to form feature 306, as shown in FIG. 3F and operation 912. Because the metal hard mask 320 has superior etch resistance compared to amorphous carbon, this embodiment can be used to etch substantially deeper holes (i.e., higher aspect ratio holes) than can be achieved using the process shown in FIGS. 1A-1F. As such, the disclosed processing methods may be used to etch deeper holes, through additional layers of material, thereby enabling fabrication of VNAND devices having substantially greater numbers alternating layers, and therefore greater density of bits.

Figure 10:
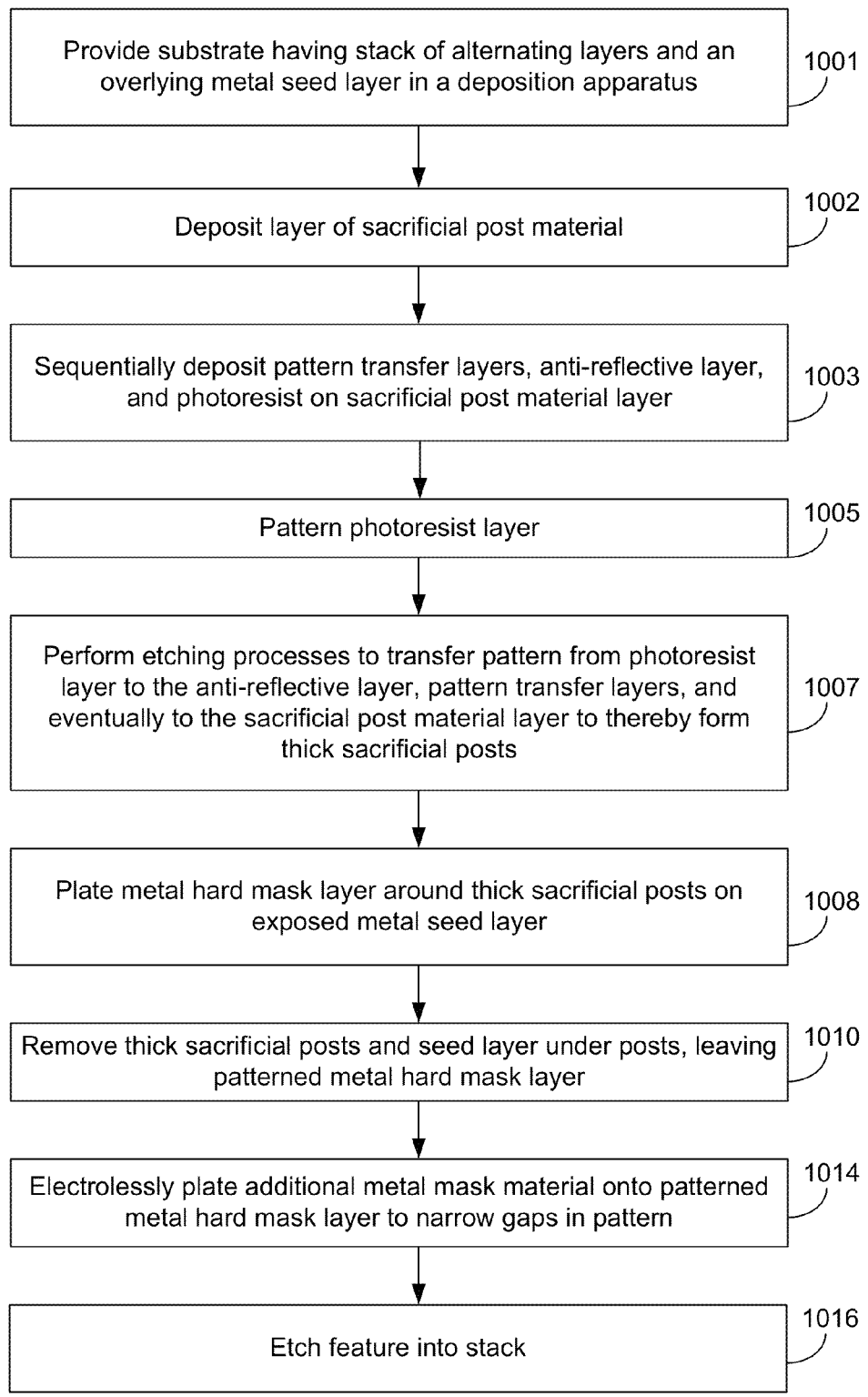
FIG. 10 is a flow chart depicting the process described in relation to FIGS. 4A-4F.

In certain embodiments, the sacrificial posts may be relatively fragile. As such, it may be desirable to form the sacrificial posts at diameters that are somewhat larger than the diameter of a feature to be etched under the post. This embodiment is shown in FIGS. 4A-4F, and is further described in relation to the flow chart shown in FIG. 10. The partially fabricated device shown in FIG. 4A corresponds to that shown in FIG. 3B, with a wider photoresist 305 pattern where the feature is to be etched. The partially fabricated device shown in FIG. 4B corresponds to that shown in FIG. 3C, with a wider sacrificial post 302c. In this embodiment, the sacrificial post 302c may have an aspect ratio between about 2:1-20:1, for example between about 4:1-10:1. The sacrificial post 302c may have a diameter that is between about 100-200% the diameter of a final feature 406, for example between about 110-150% the diameter of a final feature 406. The partially fabricated device shown in FIG. 4C corresponds to that shown in FIG. 3D, again with a wider sacrificial post 302c. The partially fabricated device shown in FIG. 4D corresponds to that shown in FIG. 3E, with a wider cavity where the sacrificial post 302c and seed layer 310 have been removed. With regard to the flow charts, operations 1001-1010 of FIG. 10 are analogous to operations 901-910 of FIG. 9, and the description will not be repeated.

At this point the metal hard mask is patterned, but it is not ready to be used as a hard mask layer because the resulting etched feature would be wider than desired (since the sacrificial post 302c was designed to be thicker/wider than the etched feature 406 to increase the mechanical integrity of the sacrificial post 302c). As such, in operation 1014, an additional layer of metal mask material 425 is plated onto the metal hard mask layer 320, as shown in FIG. 4E. The additional layer of metal mask material 425 is deposited through electroless plating in various embodiments. Electroless plating results in deposition of metal on exposed conductive surfaces. Advantageously, because the seed layer 310 can be removed before the electroless plating operation, the additional metal mask material 425 deposits only on exposed metal surfaces (e.g., the metal hard mask layer 320 and the sidewalls of the seed layer 310 (shown as exaggeratedly large)). By contrast, the additional metal mask material 425 does not plate at the bottom of the hole, since the exposed surface at the hole bottom is not conductive after removal of the seed layer. In some embodiments, the additional mask material 425 may be plated to a thickness between about 1-10 nm, for example between about 2-4 nm.

While electroplating may be used for depositing this additional mask material 425, it will require a seed layer (e.g., seed layer 310) to provide current for driving the electroplating reaction. As such, a continuous seed layer 310 would have to remain while the additional mask material 425 is electroplated. Further, electroplating deposition may proceed from the bottom up of the opening rather than around the sidewalls as desired. Electroless plating avoids both of these issues. First, because no external current is needed, no seed layer is needed to deliver the current. Second, electroless plating may be performed in a manner that produces a relatively conformal fill that more effectively covers sidewalls. After the additional mask material is deposited, the feature 406 can be etched into the stack of materials in operation 1016, as shown in FIG. 4F.

In certain implementations, some degree of plating may occur (either deliberately or indeliberately, through electroplating or electroless plating) at the bottom of the hole in the metal hard mask layer 320 during formation of the additional mask material 425. This hole-bottom plating should be etched through in order to etch the underlying stack. The hole-bottom plating may be relatively easier to etch through compared to etching through the entire thick metal hard mask layer 320 (at least because it is likely to be much thinner).

Another option for depositing the additional mask material is a selective metal CVD process. In these processes, chemical vapor deposition is used to selectively deposit metal on conductive (vs. non-conductive) surfaces. Selective metal CVD processes are discussed further in the following U.S. Patents and Patent Applications, each of which is herein incorporated by reference in its entirety: U.S. patent application Ser. No. 12/111,921, filed Apr. 29, 2008, and titled "Selective Cobalt Deposition on Copper Surfaces," U.S. Pat. No. 7,884,018, and U.S. Pat. No. 8,278,216.

Compared to a method that involves patterning a metal hard mask through etching (e.g., FIGS. 2A-2E), the methods shown in FIGS. 3A-3F and 4A-4F may produce features that are relatively smoother. For example, when etching a hole/cylinder, the hole that is formed is rounder and smoother compared to one in which the metal hard mask is patterned through etching. This is especially true where the sacrificial post material (e.g., sacrificial post material 302 in FIGS. 3A-3F) is an amorphous material. Because the metal mask material may be crystalline, direct etching of this material can create roughness and non-circularity at the grain boundaries. In contrast, where an amorphous sacrificial post material is used, the pattern can be etched into an amorphous material having no grain boundaries. This results in a smoother, rounder pattern. The metal hard mask can then be plated around the patterned sacrificial posts, having very smooth/round sidewalls where the metal hard mask contacts the sacrificial posts. These smooth/round sidewalls are maintained after the sacrificial posts are removed.

Further, the disclosed methods may not require any difficult hard mask open etch steps (i.e., directly etching a pattern into a metal hard mask). As shown and explained in relation to FIG. 2E, it is very difficult to etch patterns into metal hard mask materials, at least because many such metals do not have volatile byproducts using conventional etching chemistries. The methods shown in FIGS. 3A-3F and 4A-4F avoid this difficult process step, instead utilizing easier operations such as deposition of a seed layer, deposition and patterning of sacrificial post material, and electroplating and/or electroless plating of the metal hard mask layer around the patterned sacrificial posts. Electroplating and electroless plating can be used to plate metal films relatively easily and inexpensively, with low stress, even at substantial thicknesses.

Further, electroplating and electroless plating may deposit a metal hard mask layer at room temperature, which results in low stress or no stress films. In certain applications (e.g., FIGS. 2A-2E), a metal hard mask is deposited through physical vapor deposition (PVD) methods. These methods involve higher temperatures and result in films having higher stress. As discussed above, high stress films can cause the wafer to bow, which can prevent a substrate from properly registering on a substrate support in future processes, and can also present problems for photolithography operations that require very flat substrates for precise pattern formation. Various disclosed methods avoid these problems by depositing the metal hard mask layer through electroplating or electroless plating, which can be done at much lower temperatures. The resulting films therefore have less stress, and cause fewer problems during subsequent processing.

Electroplating and electroless plating may open up the range of metals available for use as a metal hard mask. As noted, PVD is currently being used to deposit various metal layers. However, PVD may be infeasible for depositing certain metals. Electroplating may be used to form some of these metals. Examples of metals that can be deposited relatively easily through electroplating and/or electroless plating, which cannot be easily deposited through PVD, include, but are not limited to, materials such as Co (which is magnetic), In (which is soft), and Sn (which has a low melting point).

II. Apparatus

Figure 5:
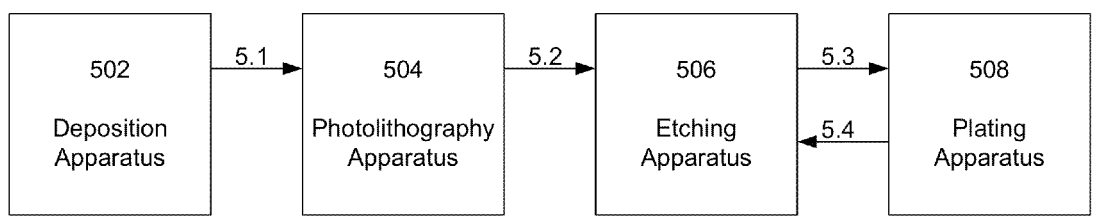
FIG. 5 schematically illustrates some semiconductor apparatus that may be used to implement the processes described in relation to FIGS. 3A-3F.

FIG. 5 shows various semiconductor processing apparatus that may be used to perform the processes described in relation to FIGS. 3A-3F. With reference to FIG. 3A, the stack 301 and the seed layer 310 may each be formed in a deposition apparatus 502. The deposition apparatus is a PVD, CVD, and/or ALD apparatus in some embodiments. Example apparatus include the ALTUS® product family, the VECTOR® product family, and the SPEED® product family, each available from Lam Research Corporation of Fremont, Calif. Next, the layer of sacrificial post material 302, the pattern transfer layer(s) 303, the anti-reflective layer 304, and the photoresist layer 305 are deposited. This deposition may also occur in the deposition apparatus 502. The apparatus used to perform each deposition may be the same or different from the apparatus used to perform other depositions (i.e., several independent deposition apparatus may be used). Certain apparatus may be particularly beneficial for forming certain film types, though often a single deposition reactor can deposit many different types of film.

The substrate is then transferred (arrow 5.1) to photolithography apparatus 504 to pattern the layer of photoresist 305. Next, the substrate is transferred (arrow 5.2) to an etching apparatus 506, and the anti-reflective layer 304, the pattern transfer layer(s) 303, and the layer of sacrificial post material 302 are each etched to sequentially transfer the pattern from the layer of photoresist 305 to the layer of sacrificial post material 302, thereby forming sacrificial posts 302c, as shown in FIG. 3C. Each layer may be etched in the same etching apparatus or a different etching apparatus, depending on the exact processes used to implement the relevant embodiment. Example etching apparatus include the 2300® FLEX™ product family, the 2300® KIYO® product family, and the 2300® VERSYS® Metal product family, each available from Lam Research Corporation of Fremont, Calif.

At this point the substrate is transferred (arrow 5.3) to a plating apparatus 508. The plating apparatus 508 may be an electroplating apparatus and/or an electroless plating apparatus. Example electroplating apparatus include the SABRE® and SABRE® 3D product families, each available from Lam Research Corporation of Fremont, Calif. Example electroless plating apparatus include 2300® ELD. The metal hard mask layer 320 is deposited in the plating apparatus 508, as shown in FIG. 3D. Next, the substrate is transferred (arrow 5.4) back to the etching apparatus 506, and the sacrificial posts 302c and seed layer 310 (below the posts 302c) are removed, as shown in FIG. 3E. These etching operations may occur in the same etching apparatus or a different etching apparatus than is used to etch the previous layers. After removal of the seed layer, the stack 301 is etched in etching apparatus 506. This operation may occur in an etching apparatus used for other processes, or in a different etching apparatus.

Figure 4A:
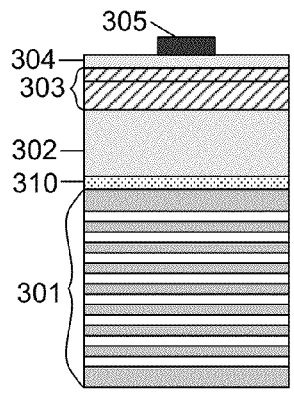
FIGS. 4A-4F depict a partially fabricated semiconductor device as it undergoes processing to form an etched recess using a metal hard mask in a process similar to that shown in FIGS. 3A-3F, with an additional step involving electroless plating to further shape the metal hard mask.
Figure 4B:
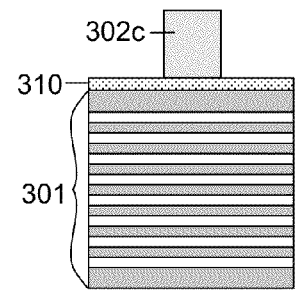
Figure 4C:
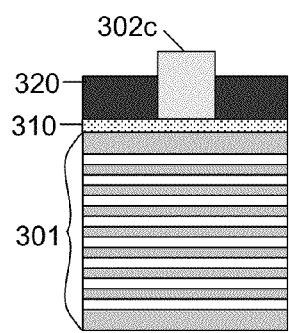
Figure 4D:
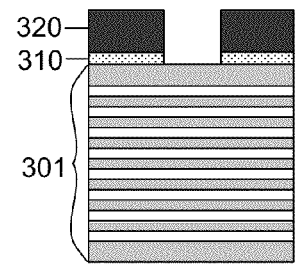
Figure 4E:
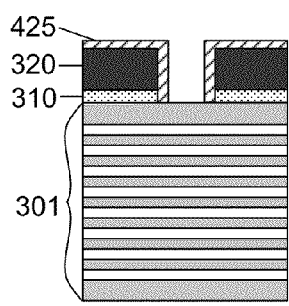
Figure 4F:
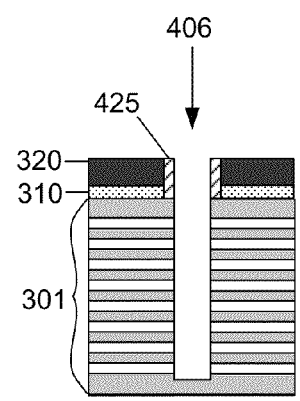
Figure 6:
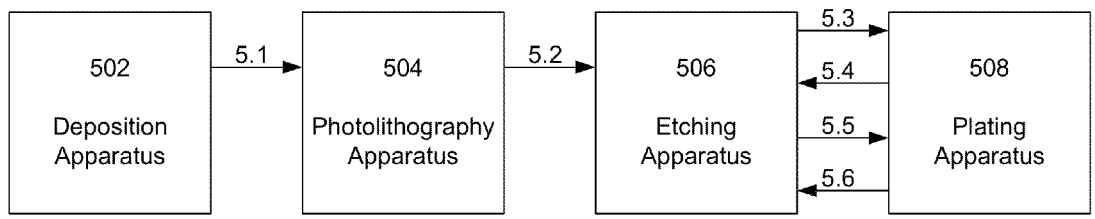
FIG. 6 illustrates some semiconductor apparatus that may be used to implement the processes described in relation to FIGS. 4A-4F.

FIG. 6 shows various semiconductor processing apparatus that may be used to perform the processes described in relation to FIGS. 4A-4F. This figure is similar to FIG. 5, with a slightly modified process flow to allow for deposition of the additional mask material 425 shown in FIG. 4E. The process flow is the same until after the sacrificial post 302c and seed layer 310 (under the sacrificial post 302c) are removed, as seen in FIG. 4D. At this point, the transfers represented by arrows 5.1-5.4 have occurred, and the substrate is in the etching apparatus 506. In order to deposit the additional mask material 425, the substrate is transferred (arrow 5.5) to the plating apparatus 508. Here, the plating apparatus 508 is an electroless plating apparatus. The plating apparatus used to plate the additional material 425 may be the same apparatus as used to plate the metal mask layer 320. In other embodiments, these two apparatus may be different (e.g., the apparatus used to plate the metal mask layer 320 may be an electroplating apparatus and the apparatus used to plate the additional mask material 425 may be an electroless plating apparatus). After the additional mask material 425 is plated, the substrate can again be transferred (arrow 5.6) to the etching apparatus 506 to etch the stack 301.

The methods described herein may be performed by any suitable apparatus or combination of apparatus, for example as described in relation to FIGS. 5 and 6. A suitable apparatus includes hardware for accomplishing the process operations and a system controller having instructions for controlling process operations in accordance with the present invention. For example, in some embodiments, the hardware may include one or more process stations included in a process tool. Further details related to the hardware of the different processing apparatus are provided in the various patents and patent applications incorporated by reference herein.

In some implementations, a controller is part of a system, which may be part of the examples described herein. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

III. Materials

The disclosed methods can be used to etch features into various materials. In the context of forming a VNAND device, the material being etched is often a stack of alternating layers of materials. In one example, the stack includes alternating layers of oxide (e.g., silicon oxide) and nitride (silicon nitride). The layers of oxide and nitride may each have a thickness between about 20-50 nm, for example between about 30-40 nm. In another example, the stack includes alternating layers of oxide (e.g., silicon oxide) and silicon (e.g., polycrystalline silicon, also referred to as polysilicon). The layers of oxide and polysilicon may have the thicknesses presented above in regard to the alternating oxide/nitride layers. In a finished device, the oxide layers provide electrical insulation between adjacent device or storage layers. The alternating layers may be deposited through any available means. Oftentimes such layers are deposited through chemical vapor deposition (CVD) or atomic layer deposition (ALD). As noted above, the stack may include at least about 40 pairs, at least about 50 pairs, at least about 60 pairs, at least about 70 pairs, or at least about 90 pairs of layers.

In the context of the methods disclosed in relation to FIGS. 3A-3F and 4A-4F, a seed layer 310 is deposited above the stack of alternating layers 301. Typically, the seed layer is made of a material that is easily removable when the mask features are defined. Example materials for the seed layer include, but are not limited to, Co, Ru, Ti, Cr, and Cu. In some embodiments the seed layer is Ti or Cu. The seed layer may be deposited through PVD, CVD, electroless plating, or ALD in certain cases. In some embodiments, the seed layer is deposited to a thickness between about 1-10 nm. The seed layer should be thick enough that it can effectively transfer electrical potential from the perimeter of the substrate inwards to allow the subsequent electroplating reaction to occur substantially uniformly over the wafer. In other words, the seed layer should have a sheet resistance that is sufficiently low that the potential applied to the wafer perimeter for electroplating should not exhibit significant ohmic drop before reaching the wafer center. The seed layer should also be thin enough for ease of subsequent etch/removal after the sacrificial post is removed.

Above the seed layer 310, a layer of sacrificial post material 302 is deposited. In various embodiments the sacrificial post material is an amorphous material. Example materials include, but are not limited to, carbon, silicon, silicon oxide, silicon nitride, and silicon carbide (any of which may be amorphous in various embodiments). Where the sacrificial post material is not amorphous, it may still be relatively smooth (e.g., having an average or median gain size below about 1 nm). The sacrificial post material may be relatively mechanically rigid. Because sacrificial posts are to be etched in the sacrificial post material, this material should be formed such that it is adequately affixed to the underlying seed layer. Otherwise, the sacrificial posts may break off after they are formed, or even while they are being formed.

As noted above, in many cases this layer is deposited to a thickness greater than the thickness of the later deposited metal hard mask layer (so that the sacrificial post material is not covered over by the metal and is easy to remove). The thickness of the sacrificial post material layer depends on the materials being etched, the conditions used to etch, the number of layers being etched/the depth of the recess being etched, the material used for the hard mask, etc. In some embodiments, the thickness of the sacrificial post material layer, as deposited, is between about 200-1000 nm, for example between about 300-500 nm.

Above the layer of sacrificial post material 302 are deposited, before forming the posts, a series of pattern transfer layer(s) 303, an anti-reflective layer 304, and photoresist 305. Deposition and patterning of these materials is generally known to those of ordinary skill in the art, and the details will not be exhaustively discussed herein. In various implementations, the pattern transfer layer(s) may be a combination of oxides, nitrides, and silicon, designed to sequentially transfer the photolithography pattern from one layer to the next. The anti-reflective layer is provided to reduce the effects of scattered and reflected light during photolithography operations.

After the layer of sacrificial post material 302 is etched to form the sacrificial posts 302c, the metal hard mask layer 320 is deposited through electroplating or electroless plating. In some embodiments, the metal hard mask layer 320 is Co, Ni, Ru, Sn, In, Pd, Ge, etc., or a combination thereof. The metal hard mask layer 320 may be the same material as the seed layer 310, or it may be a different material. The metal hard mask material should adhere to the seed layer. The deposited metal hard mask material may be relatively smooth/small grained (e.g., having a median grain size of about 1 nm or lower). Further, the metal hard mask material should be chosen such that it does not deleteriously affect the semiconductor device (e.g., the material is relatively immobile so that ions do not enter the device negatively impact electrical properties). Another consideration for the choice of the metal hard mask material is the etch rate selectivity between the metal hard mask material and the materials of the underlying stack. There should be a high selectivity between these materials so that the metal mask can withstand the processing conditions used to etch the feature in the stack. In certain embodiments, the etch rate selectivity between the metal hard mask and the underlying stack materials is at least about 4, for example at least about 8.

In various embodiments, the sacrificial post extends above the uppermost height of the metal hard mask layer such that the sacrificial post can be easily removed. In some embodiments, the metal hard mask layer is deposited to a thickness between about 200-1000 nm, for example between about 300-500 nm. Like the thickness of the layer of sacrificial post material, the thickness of the metal hard mask layer depends on various factors including the materials being etched, the material of the metal hard mask, the number of layers being etched/the depth of the feature being etched, etc.

In certain embodiments, such as that shown in FIGS. 4A-4F, additional metal mask material may be electrolessly plated onto the metal hard mask to alter the dimensions/pattern of the metal hard mask (e.g., to constrict the opening defined by the post). In certain embodiments, this additional plated metal mask material is Co, Ni, Ru, Sn, In, Pd, Ge, etc. The additional metal mask material may be the same material or a different material than the originally plated metal mask material and/or the seed layer. The additional metal mask material should adhere to the previously deposited layer of metal mask. The additional metal mask material may be relatively smooth/small grained (e.g., having an average or median grain size of about 1 nm or lower). Further, the additional mask material should be chosen such that it does not deleteriously affect the semiconductor device that is formed (e.g., low or no ion mobility, etc.). The additional metal mask material should also exhibit a high etch rate selectivity compared to the underlying stack materials in which the feature is etched. Example selectivities listed above in relation to the metal hard mask layer also apply to the additional metal mask material.

The thickness of this additional plated material will depend on the geometry of the sacrificial posts as well as the geometry of the features that are to be plated. Generally speaking, the additional material should be plated to a point where the openings are constricted to define a mask suitable for etching the recessed features at a desired dimension (e.g., the critical dimension). Where the additional material is plated relatively thinly, the resulting feature will be relatively wider. Where the additional material is plated relatively thickly, the resulting feature will be relatively thinner. In certain applications, the additional plated material has a thickness between about 1-10 nm, for example between about 2-5 nm, as deposited.

IV. Processes and Process Conditions

Various disclosed embodiments relate to processes in which a metal hard mask is plated around pre-formed sacrificial posts, as shown in FIGS. 3A-3F and 4A-4F. These methods may be referred to as "pattern plating" methods, since the hard mask layer is plated to include a particular pattern, without having to perform any separate metal etching steps to pattern the metal hard mask. Process conditions associated with certain steps of these methods will be further described in this section. Process conditions related to other steps such as deposition of the stack of alternating layers of materials, and deposition and patterning of the various pattern transfer layer(s), anti-reflective layer, and photoresist layer are known to those of ordinary skill in the art, and will not be discussed in detail.

A. Deposition of the Seed Layer

With reference to the process shown in FIGS. 3A-3F, and beginning with the partially fabricated device shown in FIG. 3A, the metal seed layer 310 may be deposited through physical vapor deposition (PVD), chemical vapor deposition (CVD), or atomic layer deposition (ALD).

Example PVD processes for depositing metals are further discussed in the following U.S. Patents, each of which is herein incorporated by reference in its entirety: U.S. Pat. No. 6,235,163, U.S. Pat. No. 7,682,966, and U.S. Pat. No. 7,645,696. Physical vapor deposition methods involve purely physical processes such as high temperature vacuum evaporation with subsequent condensation, and plasma sputter bombardment. Physical vapor deposition methods do not involve chemical reactions on the surfaces to be coated. In one example PVD process the following conditions are used. The substrate temperature is maintained between about −40° C. and +30° C., and the pressure is maintained between about 5-20 mT. Ar is flowed into the reaction chamber at a rate between about 20-100 sccm, for a duration between about 10-60 s. Plasma is struck in the reaction chamber using an RF frequency of 13.56 MHz. The plasma power may be between about 100 W-2 kW of bias power and between about 10 kW-30 kW of DC target power, assuming a single 300 mm substrate is present in the reaction chamber. Other conditions and materials may also be used as appropriate.

Example CVD processes for depositing metals are further discussed in the following U.S. Patents, each of which is herein incorporated by reference in its entirety: U.S. Pat. No. 5,028,585, U.S. Pat. No. 5,795,824, and U.S. Pat. No. 6,066,366. Example apparatus for performing CVD processes include the ALTUS® product family, the VECTOR® product family, and the SPEED® product family, all available from Lam Research Corporation of Fremont, Calif.

CVD processes for metal film deposition occur through the volatilization of metal precursors, typically at high temperatures and under vacuum. Plasma assisted CVD reactions typically involve exposing a substrate to plasma while providing one or more reactants to the reaction chamber. In various plasma assisted CVD reactions, exposure to plasma drives the chemical reaction. In various other cases, a thermal CVD process is used. In one example CVD process, the following conditions are used. The substrate temperature is maintained between about 60-80° C. The pressure is maintained between about 1-2 T. Precursor such as CCTBA (dicobalt hexacarbonyl tertbutylacetylene) is flowed into the reaction chamber in Ar carrier gas at a rate between about 20-50 sccm. The precursor flow and/or plasma exposure may have a duration between about 60-120 s. Other conditions and materials may also be used as appropriate.

Example ALD processes for depositing metals are further discussed in the following U.S. Patents and Patent Applications, each of which is herein incorporated by reference in its entirety: U.S. Pat. No. 7,220,451, U.S. Pat. No. 7,569,500, U.S. patent Ser. No. 13/084,399, and U.S. patent application Ser. No. 13/953,616, filed Jul. 29, 2013, and titled "HIGH PRESSURE, HIGH POWER PLASMA ACTIVATED CONFORMAL FILM DEPOSITION." Example apparatus for performing ALD reactions include the ALTUS® product family and the VECTOR® product family, each available from Lam Research Corporation of Fremont, Calif.

ALD processes involve exposure of the substrate to alternating cycles to atomically grow the metal film. Plasma and/or thermal energy may be provided in certain cases to drive a reaction on the substrate. These ALD processes result in very conformal films but take long times to deposit thin layers of material. One example ALD process includes exposing the substrate to a flow of CCTBA (dicobalt hexacarbonyl tertbutylacetylene) in Ar carrier gas at a rate between about 50-100 sccm for a total duration between about 120-600 s and optionally purging the reaction chamber by flowing a sweep gas and/or evacuating the reaction chamber. The substrate temperature may be maintained between about 80-100° C., and the pressure may be maintained between about 8-10 T. Other conditions and materials may also be used as appropriate.

B. Deposition of the Layer of Sacrificial Post Material

With reference to the process shown in FIGS. 3A-3F, and FIG. 3B in particular, the layer of sacrificial post material 302 may be deposited using a variety of processes. In some implementations, the layer of sacrificial post material is deposited using a CVD process, for example a plasma enhanced CVD (PECVD) process, a high plasma density CVD (HDP-CVD) process, a spin-on process, an atomic layer deposition (ALD) process, etc. An example HDP-CVD process is further discussed in U.S. Pat. No. 6,559,052, which is herein incorporated by reference in its entirety. Example apparatus are listed above. CVD processes are particularly beneficial given how rapidly the material is deposited. By contrast, ALD processes can also be used, but are much slower. Generally, the process used to deposit the layer of sacrificial post material should be relatively fast and inexpensive.

As mentioned, in some embodiments, the sacrificial post material is carbon, silicon, or silicon oxide. Conventional process conditions for forming such materials as known in the art may be employed, although a brief example will be provided. In one implementation where the sacrificial post material is amorphous silicon and PECVD is used to deposit this layer, the following conditions are used. The substrate temperature is maintained between about 150-650° C. and the pressure is maintained between about 1-10 T. A flow of silicon-containing gas such as silane is introduced into the reaction chamber at a rate between about 100 sccm-4 slm, and a flow of other gases including $H_2$, He and/or Ar are introduced into the reaction chamber at a total rate between about 0 sccm-20 slm. A plasma is generated in the reaction chamber using a frequency of about 13.56 MHz and an RF power between about 0-1500 W, assuming a single 300 mm substrate is present in the reaction chamber. The reactant delivery and plasma exposure may have a duration between about 60-300 s. Other conditions and materials may also be used as appropriate.

Spin on processes may also be used to deposit the layer of sacrificial post material. Example spin-on processes are discussed in the following U.S. Patents, each of which is herein incorporated by reference in its entirety: U.S. Pat. No. 7,192,891, and U.S. Pat. No. 7,517,817.

C. Deposition of the Metal Hard Mask

With reference to the process shown in FIGS. 3A-3F, and to FIG. 3D in particular, the metal hard mask layer 320 may be deposited through electroplating or electroless plating in various embodiments. In other embodiments, the metal hard mask layer may be deposited through PVD or CVD methods (followed by chemical mechanical polishing to expose the sacrificial posts, in these embodiments the seed layer may be omitted). Electroplating and electroless plating are conducted at relatively low temperatures and produce low stress films. The metal hard mask layer may be the same metal or a different metal than is used for the seed layer. Electroplating on semiconductor substrates is further discussed in the following U.S. Patents, each of which is herein incorporated by reference in its entirety: U.S. Pat. No. 6,074,544, U.S. Pat. No. 7,449,098, and U.S. Pat. No. 8,168,540. Electroless plating is further discussed in the following U.S. Patents, each of which is herein incorporated by reference in its entirety: U.S. Pat. No. 3,798,056, U.S. Pat. No. 6,713,122, U.S. Pat. No. 7,690,324, and U.S. Pat. No. 8,622,020. Example apparatus for electroplating and electroless plating include the SABRE® and SABRE® 3D product families, available from Lam Research Corporation of Fremont, Calif., and 2300 ELD, also available from Lam.

In electroplating methods, the substrate is immersed in an electrolytic bath containing metal ions of the metal to be plated. The electrolytic bath may contain other additives as appropriate. The substrate is often tilted during immersion to reduce the effect of bubbles becoming trapped under the substrate. Further, the substrate is often rotated during immersion and during electroplating. During or after immersion, the substrate is biased, and the metal ions become current carriers which flow towards and deposit on the surface of the substrate. In one example process where a layer of Sn is electroplated to form the metal hard mask layer, the electroplating solution contains Sn sulfate (75 g/L) in acid (e.g., ascorbic acid, 200-400 g/L) with proprietary additives. The substrate may be tilted to between about 1-20°, for example between about 1-10°, and rotated at a rate between about 25-200 RPM, for example between about 50-150 RPM. In certain implementations, a constant voltage, constant current, or constant current density may be applied during an initial portion of substrate immersion and/or plating. During plating, an applied current may range between about 1-30 mA/cm$^2$, for example between about 2-5 mA/cm$^2$. The current may be applied for a duration between about 30-60 s at a temperature of 20-30° C. Other conditions and materials may also be used as appropriate.

Electroless plating methods are similar to electroplating methods, except that there is no current applied to the substrate during plating. In one example process where a layer of Co is electrolessly plated to form the metal hard mask layer, the electrolyte solution contains cobalt sulfate (60 mM) to supply the Co ions, DMAB (dimethyl amine borane) (33 mM) as reducing agent, citric acid (400 mM) as complexing agent, and TMAH (12 wt %) to control pH. The substrate may be tilted and rotated as discussed above in relation to electroplating. The substrate may be immersed for a duration between about 300-1000 s at a temperature about 30-95° C. Other conditions and materials may also be used as appropriate.

D. Deposition of Additional Metal Hard Mask Material to Shape the Metal Hard Mask In certain embodiments, for example with reference to the process shown in FIGS. 4A-4F, additional metal hard mask material is deposited on the originally deposited hard mask material. This additional material may be electrolessly plated in many cases. One reason for depositing this additional material is that this process flow allows for the sacrificial posts to be formed at lower aspect ratios, making the posts more mechanically stable and less likely to break off. The additional material changes the shape of the metal hard mask layer, making the openings in this layer narrower than they would otherwise be.

As noted, this layer may be electrolessly plated. Electroless plating may be more appropriate than electroplating because it does not require delivery of current at the edge of the wafer and can effectively constrict the opening. With reference to FIG. 4E, the additional mask material 425 plates on the metal hard mask 320 and on the (exaggeratedly large) sidewalls of the seed layer 310. The additional mask material 425 does not plate on the stack 301, since it is not conductive. The seed layer 310 should be removed from the bottom of the feature before the additional material is plated, or else the additional material may undesirably plate at the bottom of the feature, where an opening is desired.

In certain cases it may not be necessary to remove the seed layer 310 before electrolessly plating or electroplating the additional mask material 425. For example, if the seed layer 310 and the metal hardmask layer 320 are different metals, the additional metal mask material 425 may preferentially deposit on the metal hardmask layer 320 as opposed to the seed layer 310 during electroplating or electroless plating. This selectivity will depend upon the type of metal used for each layer. E.g., Co may plate preferentially on Cu versus Ti.

Electroless deposition conditions are further described above in relation to deposition of the metal hard mask layer. The solution used to electrolessly plate the additional metal mask material may be the same or different from a solution used to electrolessly plate the original mask material. For example, where the originally plated layer of metal mask material is a first metal and the additional metal mask material is a second (different) metal, the two plating solutions will be different. Or for the same metal, different compositions may be needed for the very different thicknesses being plated. In order to plate the additional metal mask material to an appropriate thickness (e.g., between about 2-4 nm), the deposition process may have a duration between about 30-60 s.

As noted above, the additional metal mask material may also be formed through CVD processes such as selective metal CVD processes.

E. Etching Various Layers to Define Sacrificial Posts

After the photoresist is patterned, the anti-reflective layer and pattern transfer layer(s) are etched. These processes are familiar to those of ordinary skill in the art, and for the sake of brevity these processes will not be described in detail. After the pattern is transferred to the bottom-most pattern transfer layer, the layer of sacrificial post material is etched to form the sacrificial posts. In certain applications, the layer of sacrificial post material is etched through plasma-based etching methods. Example process conditions may be as follows: $CH_2F_2$ (50 sccm)+$SF_6$ (20 sccm)+$N_2$ (100 sccm) with 1000 W 27 MHz RF at 50 mT pressure and 10° C. for etching amorphous silicon using the appropriate pattern transfer mask (e.g., SiN or TiN). Another example process conditions may be as follows: H$_2$ (600 sccm)+N$_2$ (200 sccm) with 750 W 60 MHz RF at 30 mT pressure and 30° C. for etching amorphous carbon using the appropriate pattern transfer mask (e.g., TEOS-based film).

F. Etching the Stack After Removal of Sacrificial Posts

High aspect ratio features can be etched into stack materials using plasma-based etching methods. In various embodiments, etchant gas is introduced into a reaction chamber and a plasma is generated from the etchant gas. A substrate is exposed to the plasma and features are etched into the substrate. Often the plasma is a capacitively coupled plasma, and the substrate/substrate support acts as one of the electrodes. Charged species are attracted to the substrate to cause anisotropic etching. A number of different etching chemistries may be used. One common etching chemistry involves the use of fluorocarbons (C$_x$H$_y$F$_z$). Example fluorocarbons include, but are not limited to, CF4, CHF3, CH2F2, CH3F, C$_4$F$_6$ and C$_4$F$_8$, which may form charged or uncharged fragments including CF, CF$_2$, CF$_3$, and F. Without wishing to be bound by theory or mechanism of action, where the stack includes alternating layers of oxide and nitride, the CF$_x$ species may be the main species that etch the stack. Similarly, where the stack includes alternating layers of oxide and polysilicon, the main species that etches the stack may be F. Other example etching chemistries may include, for example, NF$_3$, and SF$_6$ with addition of N$_2$, O$_2$, H$_2$, plus other gases that include non-F halide(s), etc.

In one example etching process, CH$_2$F$_2$+NF$_3$+H$_2$+N$_2$ are flowed into a reaction chamber at a rate between about 20-100 sccm each. The substrate is maintained at a temperature between about 30-60° C., and the pressure is maintained between about 10-100 mT. The plasma may be generated at a frequency of about 13.56 MHz or 27 MHz at an RF power between about 500-2000 W (assuming a single 300 mm substrate is present). The plasma may be exposed for a duration between about 200-2000 s. Other conditions and materials may also be used as appropriate.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

What is claimed is:

1. A method of forming recessed features on a substrate, the method comprising:
   (a) forming sacrificial posts on the substrate, said substrate comprising a conductive seed layer over an underlying material, wherein the sacrificial posts are formed directly above regions where the recessed features are to be formed in the underlying material;
   (b) depositing a metal hard mask material on the conductive seed layer around the sacrificial posts to form a metal hard mask layer through electroplating, electroless plating, or chemical vapor deposition;
   (c) removing the sacrificial posts to form openings in the metal hard mask layer;
   (d) removing the conductive seed layer in the openings in the metal hard mask layer; and
   (e) etching the underlying material to thereby form the recessed features directly under the openings in the metal hard mask layer.

2. The method of claim 1, wherein the underlying material comprises alternating layers of silicon oxide and silicon nitride.

3. The method of claim 1, wherein the underlying material comprises alternating layers of silicon oxide and polysilicon.

4. The method of claim 1, further comprising after (d) and before (e), depositing additional metal mask material on the metal hard mask layer through electroless plating or chemical vapor deposition to thereby narrow the openings in the metal hard mask layer.

5. The method of claim 4, wherein the additional metal mask material comprises a material selected from the group consisting of: Co, Ni, Ru, Sn, In, Pd, Ge, and combinations thereof.

6. The method of claim 1, wherein the recessed features have an aspect ratio of at least about 40.

7. The method of claim 6, wherein the recessed features have an aspect ratio of at least about 60.

8. The method of claim 1, wherein the recessed features have a depth of at least about 2.5 μm.

9. The method of claim 1, wherein the metal hard mask material comprises a material selected from the group consisting of Co, Ni, Ru, Sn, In, Pd, Ge, and combinations thereof.

10. The method of claim 1, wherein the conductive seed layer comprises a material selected from the group consisting of Co, Ru, Ti, Cr, Cu, and combinations thereof.

11. The method of claim 1, wherein the sacrificial posts comprise a material selected from the group consisting of carbon, silicon, silicon oxide, silicon nitride, silicon carbide, and combinations thereof.

12. The method of claim 11, wherein the material of the sacrificial posts is amorphous.

13. The method of claim 1, wherein the sacrificial posts have a width between about 5-200 nm.

14. The method of claim 13, wherein the sacrificial posts have an aspect ratio of at least about 2:1.

15. The method of claim 1, wherein forming the sacrificial posts comprises depositing sacrificial post material, depositing one or more intermediate layers, depositing a layer of photoresist, patterning the photoresist, etching the one or more intermediate layers, and etching the sacrificial post material to form the sacrificial posts.

16. The method of claim 15, wherein the sacrificial post material is deposited through a CVD process, a PVD process, an ALD process, or a spin-on process.

17. The method of claim 16, wherein the sacrificial posts material comprises a material selected from the group consisting of carbon, silicon, silicon oxide, silicon nitride, silicon carbide, and combinations thereof.

18. The method of claim 1, wherein operation (b) occurs through electroplating.

19. The method of claim 1, wherein operation (b) occurs through electroless plating.

20. The method of claim 1, wherein operation (b) occurs through chemical vapor deposition.

21. The method of claim 1, wherein operation (b) comprises plating the metal hard mask layer to a thickness between about 25 nm-2.5 µm.

* * * * *